(12) United States Patent  
Fischione et al.

(10) Patent No.: US 12,362,130 B2  
(45) Date of Patent: Jul. 15, 2025

(54) SYSTEM AND METHOD FOR UNIFORM ION MILLING

(71) Applicant: E.A. Fischione Instruments, Inc., Export, PA (US)

(72) Inventors: Paul E Fischione, Export, PA (US); Joseph M Matesa, Spring Church, PA (US); Junhai Liu, North Huntingdon, PA (US); Michael F Boccabella, Irwin, PA (US)

(73) Assignee: E.A. Fischione Instruments, Inc., Export, PA (US)

( * ) Notice: Subject to any disclaimer, the term of this patent is extended or adjusted under 35 U.S.C. 154(b) by 313 days.

(21) Appl. No.: 17/672,248

(22) Filed: Feb. 15, 2022

(65) Prior Publication Data

US 2022/0262593 A1 Aug. 18, 2022

Related U.S. Application Data

(60) Provisional application No. 63/149,493, filed on Feb. 15, 2021.

(51) Int. Cl.
*H01J 37/147* (2006.01)
*H01J 37/20* (2006.01)
*H01J 37/31* (2006.01)

(52) U.S. Cl.
CPC ............ *H01J 37/147* (2013.01); *H01J 37/20* (2013.01); *H01J 37/31* (2013.01);
(Continued)

(58) Field of Classification Search
CPC .......... H01J 37/147; H01J 37/20; H01J 37/31; H01J 37/3007; H01J 37/3023;
(Continued)

(56) References Cited

U.S. PATENT DOCUMENTS

| 5,104,684 A | 4/1992 | Tao et al. |
| 5,633,502 A | 5/1997 | Fischione |

(Continued)

FOREIGN PATENT DOCUMENTS

| EP | 2869328 | * | 6/2015 |
| WO | WO01/67501 A1 | * | 9/2001 |

(Continued)

OTHER PUBLICATIONS

D.H. Narum and R.F.W. Pease, "A variable energy focused ion beam system for in situ microfabrication" J. Vacuum Technology, B6(3) May/Jun. 2988, pp. 966-273.

(Continued)

*Primary Examiner* — Rodney G McDonald  
(74) *Attorney, Agent, or Firm* — Metz Lewis Brodman Must O'Keefe

(57) ABSTRACT

A system and method for the precise and uniform material removal or delayering of a large area of a sample is provided. The size of the milled area is controllable, ranging from sub-millimeter to multi-millimeter scale and the depth resolution is controllable on the nanometer scale. A controlled singularly charged ion beam is scanned across the sample surface in such a manner to normalize the ion density distribution from the sample center toward the periphery to realize uniform delayering.

28 Claims, 14 Drawing Sheets

(52) U.S. Cl.
CPC ............... *H01J 2237/2001* (2013.01); *H01J 2237/20214* (2013.01); *H01J 2237/20221* (2013.01)

(58) Field of Classification Search
CPC ............ H01J 37/3053; H01J 37/3005; H01J 2237/2001; H01J 2237/20214; H01J 2237/20221; H01J 2237/049; H01J 2237/061; H01J 2237/30455; H01J 2237/30472; H01J 2237/30483; H01J 2237/3151
USPC .................................... 204/192.34, 298.36
See application file for complete search history.

(56) References Cited

U.S. PATENT DOCUMENTS

| | | | |
|---|---|---|---|
| 6,730,237 B2 | 5/2004 | Sievers et al. | |
| 6,756,600 B2 | 6/2004 | Ng et al. | |
| 7,132,673 B2 | 11/2006 | Fischione et al. | |
| 7,504,623 B2 | 3/2009 | Fischione et al. | |
| 2002/0094694 A1 | 7/2002 | Russell et al. | |
| 2003/0047691 A1 | 3/2003 | Musil et al. | |
| 2005/0103746 A1 | 5/2005 | Nadeau et al. | |
| 2007/0023701 A1 | 2/2007 | Fischione et al. | |
| 2008/0067408 A1 | 3/2008 | Winkler | |
| 2008/0308742 A1* | 12/2008 | Gerlach | H01J 37/28 250/397 |
| 2014/0363978 A1* | 12/2014 | Martin | H01J 37/3053 216/61 |
| 2015/0090583 A1* | 4/2015 | Kodaira | H01J 37/32357 204/192.34 |
| 2015/0357159 A1* | 12/2015 | Stone | H01J 37/317 204/298.36 |
| 2020/0027690 A1* | 1/2020 | Wacaser | H01J 37/2955 |

FOREIGN PATENT DOCUMENTS

| | | | |
|---|---|---|---|
| WO | WO02/05315 A1 * | 1/2002 | |
| WO | 2003073481 A3 | 4/2003 | |
| WO | 03073481 A2 | 9/2003 | |

OTHER PUBLICATIONS

Model 1010 Ion Mill, E.A Fischione Instruments, Inc., downloaded from www.fischione.com, Oct. 20, 2004.
Model 1010 Ion Mill, Tabletop Precision Ion Milling and Polishing System, E.A Fischione Instruments, Inc., Part No. 009-13-2, Rev. 0.
691 Precision Ion Polishing System (PIPS™), Gatan, Inc., downloaded from www.gatan.com Oct. 24, 2004.
Model 691 Precision Ion Polishing System, Gatan, Inc.
International Searching Authority; International Search Report and Written Opinion of the International Searching Authority; International Application No. PCT/US22/16448; Patent Cooperation Treaty; pp. 1-11; publisher United States International Searching Authority; Published Alexandria, Virginia, US; copyright and mailing date Jul. 27, 2022; copy enclosed (11 pages).
European Patent Office, Supplementary Partial European Search Report for European App. No. 22753522, mailed on Dec. 13, 2024 12 pages.
R. Nassar, M. Vasile, and W. Zhang, Mathematical modeling of focused ion beam microfabrication, Institute for Micromanufacturing, Louisiana Tech University, Ruston, Louisiana, 7 pages.
Nassar R et al: "Mathematical modeling of 23 focused ion beam microfabrication", Journal of Vacuum Science & Technology B: Microelectronicsprocessing and Phenomena, American Vacuum Society, New York, NY, US, vol. 16, No. 1, Jan. 1, 1998, pp. 109-115, XP012006579, ISSN: 0734-211x, DOI: 10.1116/1.589763, p. 110, right-hand column, paragraph 5.

* cited by examiner

SYSTEM AND METHOD FOR UNIFORM ION MILLING

BACKGROUND OF THE INVENTION

Field of the Invention

The present invention relates to the controlled deconstruction of samples such as integrated circuits or IC chips, optical devices, electronic devices and combinations thereof for identification of chip structure and chemistry and/or failure analysis. More specifically, it relates to a system and methods of uniformly delayering relatively large areas of an IC chip through the use of a controllable ion beam.

Description of the Prior Art

In the semiconductor industry, IC chips are incredibly complex, having up to billions of individual devices including transistors within each integrated circuit. IC chips include many layers, each having a given thickness in a range from one atomic plane to a few microns. A layer may occupy the entire surface or a partial surface of the chip. Each layer may include parts of the various components of the integrated circuits which may comprise metals, alloys, semiconducting materials, ceramics, insulators, or any other material. This pertains to both logic and memory devices.

During the research and development phase and continuing through the manufacturing process, it is essential to understand the material properties associated with the various devices contained within an integrated circuit. Chips are typically formed by growth, deposition, etching and polishing processes in order to generate the physical electronic circuitry derived from schematics. These processes are incredibly complex and if not precisely controlled, can yield defects within the chips.

Typically, the yield of acceptable IC chips in the initial manufacturing stages of a new design is low. Manufacturers need a few to several months to improve the fabrication process for increased yield. Feedback from various analytical techniques is utilized for process control to enhance both chip performance and yield. For instance, metrology deals with the precise measurement of devices within the chip. Electrical probing is employed to test individual circuits.

Quality control is extremely important during and after chip manufacturing. Reliability of semiconductor devices is paramount. When fault conditions occur, intense effort is dedicated to failure analysis. Because chips are often returned from the field, it is essential to conduct postmortem, single-defect failure analysis by carefully removing material until the fault location is revealed.

For yield enhancement and quality control during manufacturing, and failure analysis after production, having access to individual device features for various property quantification techniques is essential.

Access to individual features for testing can be accomplished through reverse engineering or controlled deconstruction of the device. For instance, qualified and unqualified chips are reverse engineered to determine if the features meet the expected specifications. An engineer will check the position, width and thickness of internal features including vias, chemical composition, transistor and/or memory well dimensions, and the like. The engineer will also attempt to locate and identify precise defects. This reverse engineering information will be provided to process engineering for yield enhancement purposes.

Reverse engineering involves serial delayering of the chip or sample and subsequent analysis at each layer. This process is incredibly complex, especially taking into consideration the number of features spread among multiple quantities of layers, sometimes in excess of 100. Further adding to the complexity is that each of these layers possesses a thickness of approximately 1 nm-2000 nm and is often comprised of multiple elements to support different electronic circuitry.

Currently, 5 nm technology nodes in the IC industry are used commercially and 2-3 nm scale is being developed. Feature sizes are trending ever smaller, down to 1 nm or less.

There are various techniques used for delayering. For instance, mechanical polishing is one method which uses particles of an abrasive compound of a micron- or sub-micron scale to abrade the surface of the sample. However, these particles create micron- or sub-micron scale artifacts or scratches in the sample surface which potentially destroy important chip characteristics. Mechanical methods also lack precise control over the amount of material removed.

Chemical etching is used to remove material by subjecting the chip to various chemicals, causing a chemical reaction which removes material from the chip surface. However, different materials within the chip react at different etching rates, depending upon the etchant chemistry. This may result in preferentially or non-uniform material removal.

Plasma etching is another method to remove material from IC chips. This method uses combinations of ionized reactive gases and/or non-reactive gases, ionized under vacuum by a strong electric field. Reactive ions produce both a chemical reaction and a bombardment, or sputtering effect, on a chip surface, thereby removing material from the surface. Non-reactive ions only cause physical bombardment, thereby sputtering off material. Non-uniformities in elemental composition, material density and etch species can adversely impact etching rates and material removal uniformity.

Broad-beam ion milling is also used to delayer chips. In this process, the center of the ion beam usually has increased energy density as compared with the periphery, or tail, of the beam. Therefore, the center of the chip is typically milled faster than the edges, creating a concave milling spot in the center where the ion beam is strongest and a shallower depth at the edges where the ion beam density is weaker. This concave geometric surface profile precludes the ability to image and analyze features located within a large area of a single chip layer.

More recent developments in delayering technology are Focused Ion Beam, or FIB, and plasma FIB, or PFIB, where an ion beam is more intensely focused. However, the drawbacks of these methods are a slow milling rate, a relatively small milled area, and the implantation of chemically reactive elements such as but not limited to gallium.

Three basic requirements needed for more uniform delayering are: 1) uniform flatness or planarity of the prepared area; 2) a large area up to 10 mm by 10 mm, or greater; and 3) controllable depth resolution, preferably approaching 1 nm. What is needed in the art, therefore, is a device and method to achieve the delayering of an entire chip with sufficient resolution, enabling the precise and uniform removal of individual layers. Furthermore, the system needs to achieve planarity within a given layer to allow surface characteristic measurements to be conducted within the area of interest.

SUMMARY OF THE INVENTION

Systems and methods for uniform delayering across an entire sample surface by ion milling are disclosed. Specifically, the system includes one or more ion beam sources in a vacuum chamber, a fixed or rotating sample stage, a control unit to control the ion beam sources for selectively removing one or more layers uniformly across a whole sample such as an IC chip, and at least one detector, such as: an optical microscope, a CCD or CMOS camera, scanning electron microscope (SEM), energy dispersive spectroscopy (EDS), secondary ion mass spectroscopy (SIMS), and/or an Auger probe.

A core aspect of the process is the creation of a generally cylindrical ion beam which maintains its profile over a long working distance, typically up to 10 cm. In addition, it is essential to have the ability to scan, or raster, the beam across a large area to uniformly expose individual layer structures within the chip. To achieve consistent milling, it is generally important to direct the ion beam at a glancing angle relative to the chip surface, with such angle preferably approaching zero degrees. Furthermore, it is important to segregate the ionic species within the beam and eliminate neutrally charged particles. In this way, a beam comprised of only charged particles (ions) is preferably directed in a controllable manner with respect to the chip surface.

To establish planarity within an individual layer, it is important to control the ion beam in such a manner so that it can uniformly remove material independent of device geometry and elemental composition. To achieve this objective, the application of an in situ sensing system utilizing detectors with output data that is coupled with ion source performance in a feedback control loop may be utilized.

For effective delayering, it is essential to maintain the ion density distribution in a uniform manner across the sample surface. Rotation of the sample is also employed to minimize dissimilar milling rates caused by the various elements contained within the chip which sputter at different rates. Typically, the harder, more slowly milling elements shadow the softer, more rapidly milling elements, resulting in a relatively planar surface.

The material removal method of the present invention uses a controlled ion beam, scanned across the sample surface in such a manner to normalize the ion density distribution. More specifically, the system includes an ion beam source generating an ion beam. The ion source technology is preferably electron impact, but may be other types of ion source technology such as Electron Cyclotron Resonance (ECR).

The electron impact ionization source is comprised of a filament cartridge to initiate the flow of electrons and then direct them into an ionization chamber. In the ionization chamber, electrons interact with the process gas also contained within this chamber to create ions. Ions are subsequently extracted and directed through the focusing lens component of the ion source.

The exit of the ion beam source contains a beam steering mechanism such as raster electrodes or deflection electrodes and preferably comprise a number of independently controlled steering rods. The beam steering mechanism is designed to deflect ions in both the X and Y directions with respect to the sample surface. Both beam direction and raster amplitude are therefore preferably adjustable. The X-X raster function of the electrodes scans the ion beam parallel to the sample surface. The ion beam source is mounted to the system so that the resulting ion beam emitted therefrom is substantially parallel to the sample surface and does not intersect the sample surface under zero deflection conditions. Applying Y deflection directs the ion beam toward the sample surface.

The steering mechanism also electrostatically causes non-charged particles to separate from the ion beam by deflecting only the charged particles. Neutral atoms are unaffected and continue in a parallel path above the sample surface. In this way, only ions impinge upon the surface as a function of applying Y deflection.

Through a momentum transfer/sputtering process, material is ejected from the sample surface in such a controlled manner to yield uniform delayering. A control unit drives the activation of the ion beam source and steering mechanism and controls and adjusts the raster amplitude and scan rate.

For controlled milling, ion beam scanning is dependent upon feedback from the output of the various detectors. Surface data may be comprised of an image, spectrum, or other information to characterize the structure and chemistry of a given layer. For instance, various detectors capture signals point-by-point from the milled sample surface, with the size of the point being roughly the size of either the ion or electron beam. Such detectors can be used for the analytical determination of various devices present within a corresponding layer of the sample. Detectors may include a camera such as an optical camera which captures the physical topography of the sample surface to determine the uniformity of the surface. An illumination source may assist with optical imaging.

The scanning of the electron beam with respect to the sample surface causes a volume interaction between the impinging electrons and the sample material. This interaction is dependent upon both the accelerating voltage of the electron beam and the elemental composition of the sample. The interaction yields both x-rays and different types of electrons, e.g., backscatter and secondary. The characteristics of the electrons and x-rays generated depend upon both surface properties and atomic interactions.

Depth profile information is generated by the interaction of electrons created by the SEM and the corresponding sample volume. Detector technology and advanced mathematics yield information relative to the depth profile of the milled area. This is achieved through the combination of system electronics and control of the milling process.

A Secondary Electron Detector or SED, such as an Everhart-Thornley type, may be used to yield information relating to the sample surface by capturing and processing either electrons created by the impingement of the electron beam or ion-induced secondary electrons created by the impingement of the ion beam. By varying the accelerating voltage of the SEM, in conjunction with Back Scattered Electron Detector or BSE technology, depth information can be generated due to changes in a material's interaction volume versus voltage. Additional detectors may include EDS, SIMS, or Auger probes for analyzing the milled surface structure and chemical composition, as well as the sputtered byproducts derived from various layers during the delayering process.

The control unit receives and analyzes output from the various detector technologies to quantify and determine compositions of individual device layers during the delayering process and to assess the status of milling. For instance, the control unit creates a depth profile map from data generated at the sample center, sample periphery, and at any quantity of points in between. Depth profile variations with respect to their corresponding position are then input into a mathematical milling algorithm. An algorithm has been developed such that the ion density distribution is adjustable as the beam moves across the sample in order to realize uniform delayering. A milling factor k of the algorithm, as more fully discussed below, is adjusted and the control unit sends revised operative instructions in real time to the ion source for revisions to the milling pattern, physically altering the ion beam raster pattern in terms of both dwell time and the corresponding current density per point. This method of continuous feedback subsequently minimizes changes in depth, Δd, as more fully discussed below, resulting in a planar surface.

Accordingly, the control unit processes data and provides commands to allow for uniformly removing a layer of an entire IC chip, wherein the layer comprises one or more materials. Computer-managed data can be loaded into memory and executed on one or more microelectronic devices to control the ion beam source to selectively remove each of the layers of said chip at respective appropriate rates.

Layer geometry and elemental composition are very well known within the semiconductor industry as they are the most fundamental aspect of chip architecture. Initial maps created during the chip design process are used to establish features such as but not limited to transistors, memory wells, and others and the corresponding interconnections between these features. Then, by means of lithography, these maps are printed onto various chip layers which result in the device circuitry. Circuit maps are well known by the semiconductor device manufacturer because they are the fundamental basis for chip creation; however, these maps are highly confidential.

The system is optionally provided with the ability to input surface maps of individual layers. Control electronics and corresponding software capture and analyze data from various detectors and create a map of sample characteristics during the milling process. By varying the accelerating voltage of the SEM electron beam, information is generated from the surface layer being milled, as well as from at least one layer below. This real-time representation of the sample is then compared to the original device map. The milling factor k is subsequently adjusted to normalize milling across the sample surface in order to create a uniform and planar profile across the complete area of a given chip layer, based upon the relative removal rate of material with respect to the relevant surface.

Ion beam performance characteristics need to be variable to achieve optimal sample characteristics. For example, a large beam energy increases the milling rate; however, artifacts may result. Lower energy typically produces a high-quality surface; however, the corresponding milling rate is reduced.

Ion milling exposes hierarchical circuit information using data acquired from each layer. Image processing data when the structure of a given layer is known may be in the form of a structure map. This data can then be compared to real-time information for process adjustment and termination.

An additional technique includes acquisition of images and corresponding data from each of the different layers and then conducting a reconstruction to provide information corresponding to feature geometry and elemental composition. This results in a three-dimensional representation of chip structure and chemistry. It can also be used as an end-point determination method to stop the delayering process.

Observations and measurements made during ion milling may be subsequently adjusted by means of a self-supervised learning process, or artificial intelligence, incorporating a feedback loop which adjusts the milling parameters based upon observed results. An individual milling protocol can be created for unique part types and applied to all chips possessing identical characteristics using this learning technology.

The system involves placing the chip or sample into a vacuum chamber, operating ion and electron beams, obtaining and processing signals from various detectors, and dynamically adjusting one or more operating parameters associated with the ion beam source to selectively remove specific and individual layers within the chip at respective appropriate rates.

The invention also includes methods to acquire data from the top surfaces of the chip. The surface data may comprise a picture, image, chemical composition or other data representation capable of characterizing the features or other aspects of the chip. The method may optionally be performed wherein the step of removing the layer of designed thickness is achieved in a single step and the rate of removal for each material present within the layer of designed thickness is the same. When the respective rate of removal for each material differs, a series of repeated steps, each with the ion beam source operating at different characteristics results in the uniform removal of a layer of a designed thickness. The method may further comprise the step of repeating the aforementioned steps until either a predetermined number of layers or predetermined total thickness of the chip, both as determined by the user, have been removed. The method may further comprise the step of producing hierarchical circuit schematics using the acquired data from each layer.

With the present invention, the size of the milled area is controllable, ranging from sub-millimeter to multi-millimeter scale. Depth resolution is also controllable on the nanometer scale. The system and method of the present invention allow chips to be precisely delayered to determine if features meet the expected specifications in terms of position, dimensions, and elemental composition. The required analysis of chip structure and chemistry, combined with the need for a fast, precise, and consistent method of uniform delayering has made this invention essential. This type of delayering allows for subsequent imaging and analysis employing methods such as optical/electron microscopy, electrical property measurements, and various forms of spectroscopy.

The present ion milling system and method, together with their particular features and advantages, will become more apparent from the following detailed description and with reference to the appended drawings.

DESCRIPTION OF THE DRAWINGS

FIG. 1 is a sectional representation of the resulting delayering produced by a prior art ion beam milling apparatus, showing a concave surface characteristic.

FIG. 22 is a partially exploded view of the focus assembly of FIG. 18.

Like reference numerals refer to like parts throughout the several views of the drawings. The figures are not intended to limit the present invention to the specific embodiment they depict. The drawings are not necessarily to scale.

DETAILED DESCRIPTION OF THE PREFERRED EMBODIMENTS

As shown in the accompanying drawings, the present invention is directed to a system and methods of delayering samples such as IC chips with a rastering ion beam to achieve uniform delayering across the sample surface. As used herein, a layer refers to a uniform thickness of one or more materials laid upon or spread over a surface. The thickness can be equal to one atomic plane up to a few or several microns. The layer may occupy the entire surface or a partial surface. A sample may refer to metals, alloys, semiconductor materials, ceramics, insulators or any other solid materials. A sample may also refer to, but is not limited to semiconductor devices, integrated circuit chips, a layer of metals and dielectrics of any thickness, one or more materials in an area of any size, optical devices, electronic devices, or any combinations thereof. Uniform delayering refers to the removal of one or more layers in a milling process, partially or wholly, wherein the one or more layers or portions thereof may comprise one or more materials; wherein, the one or more layers may be of any desired and uniform thickness.

Broadly characterized, the present invention provides a system and methods of delayering samples such as integrated circuits and other solid materials on a large area scale. More particularly, embodiments concern an apparatus and method for facilitating the removal of one or more layers from a sample of an integrated circuit with a desired uniform thickness in an area up to approximately 10 mm in diameter, or greater. Embodiments advantageously maintain the planarity of the surface of the sample during delayering of the defined area. Furthermore, a whole delayering process may contain many endpoints at which features, wire patterns, chemical composition, and other interested properties can be analyzed and/or recorded for specification inspection, failure analysis, or 3D reconstructions.

In a conventional ion beam, ion flux density within the beam typically follows a Gaussian profile; whereby, the center area possesses higher density and the periphery, or tail of the beam, possesses a lower density. When utilizing broad beam ion milling, the center of the sample is therefore milled more rapidly as compared to the periphery, thus precluding the ability to uniformly delayer a semiconductor chip layer.

Referring to FIG. 1, the delayering result utilizing a conventional ion beam is shown by curve 1 on sample 2. Usually, the milling rate R in the delayering process is determined by the ion density Id per unit milling area A:

$$R = c * Id/A = c * Id/r * \Delta r \quad (1)$$

where $A = r * \Delta r$ and r is the radius of a circular milling mark, c is constant.

Figure 2:
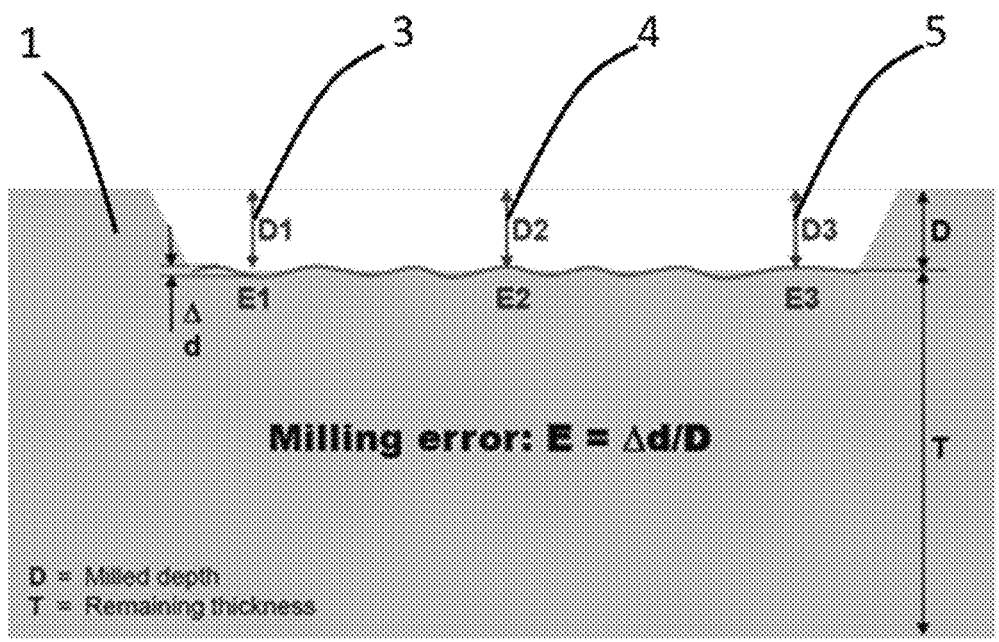
FIG. 2 is a sectional representation of a delayering result achieved by the present invention.

The present invention addresses this uneven delayering by creating a relatively small beam with respect to the sample size and scanning or rastering it across the sample surface in a particular and controlled manner to promote uniform milling, shown in FIG. 2, which is independent of both device position and elemental composition.

Referring to FIG. 2, a milled trench D on Sample 1 is equal to the sum of depths 3, 4, 5 divided by 3.

$$D = (D1 + D2 + D3)/3 \quad (2)$$

$$\text{Nonplanarity } \Delta d = (|D1 - D| + |D2 - D| + |D3 - D|)/3 \quad (3)$$

$$\text{Milling error } \Delta E = \Delta d/D \quad (4)$$

The present system 500 and method for delayering samples 1 allows a large area of a sample 1 to be delayered while making the $\Delta d$ as small as possible, down to a few nanometers, and the $\Delta E$ less than 1%, typically 0.1%.

Figure 3:
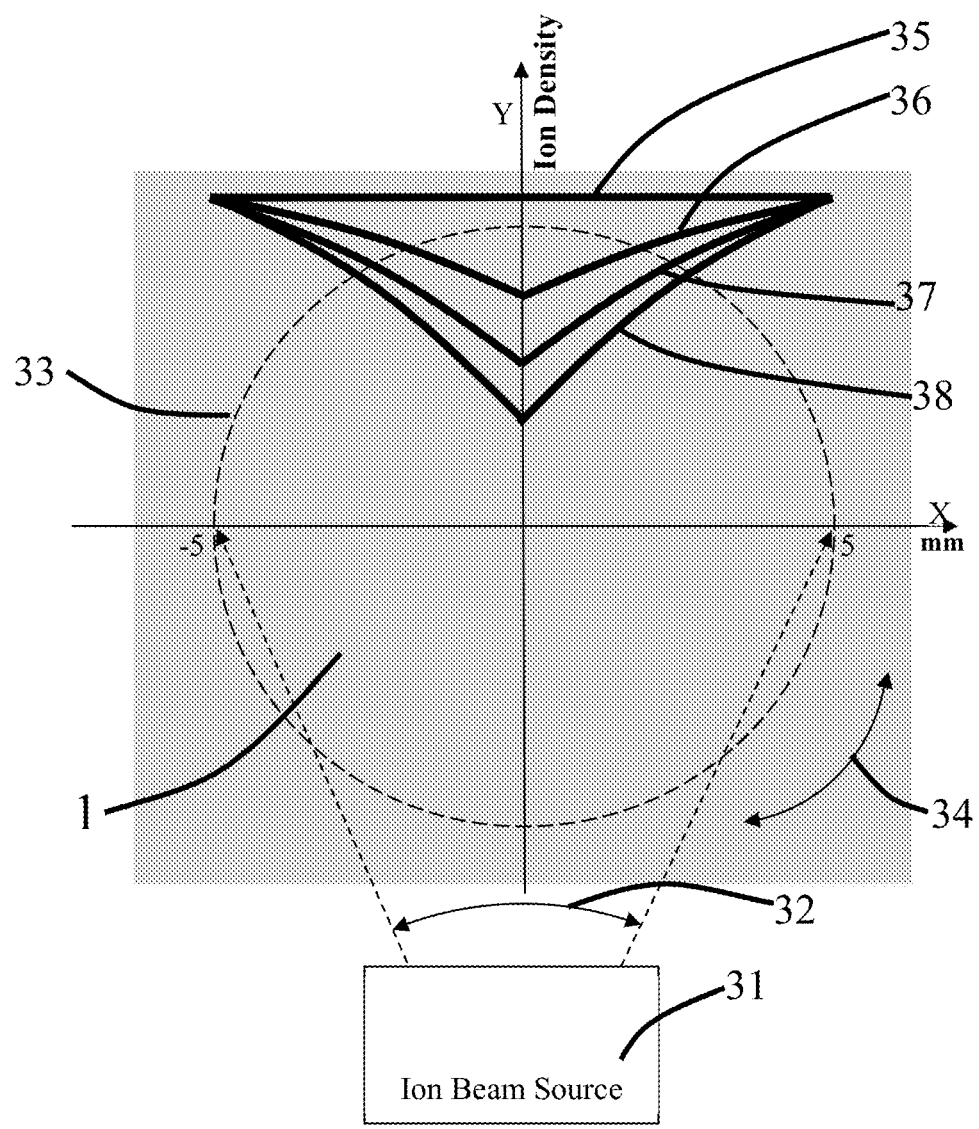
FIG. 3 is a schematic representation of the rastering of an ion beam and corresponding ion density distribution along the X axis of a sample surface.

This technique yields an ion density distribution as shown in FIG. 3. Specifically, an ion beam source 31 emits an ion beam 32, shown as a range in this Figure, onto the surface of sample 1 at an incident angle. The sample 1 rotates along direction 34 during the delayering process. The resulting milled area 33 is therefore circular in shape.

The speed range of rotation is variable in the range of 0-100 rpm. The direction of rotation can be either clockwise or counterclockwise. The incident beam 32 angle range is 0.0 to 15 degrees. The size of the milling area 33 is adjustable by varying the ion beam 32 scanning parameters, with a typical milled area being in the range of 1 mm to 10 mm in diameter, or greater.

The ion density distribution along the X-axis may be shown by one of curves 35, 36, 37 or 38. Curve 35 is a uniform density distribution in which the sample center milling rate is high and the milling rate at the periphery is low.

Milling rate is generally a function of ion dosage or density with a higher density beam producing a higher milling rate. To achieve uniform milling for the delayering purpose, the milling rate across the sample surface needs to be variable to compensate for geometric and elemental composition differences within a chip layer.

The theoretical density distribution curve 36 in FIG. 3 may not be sufficient to reduce the ion density at the center area. As a result, the milling rate is still higher than that of the periphery. Another possible density distribution is curve 38 in FIG. 3, which may cause too much of a reduction of the beam density on the sample center area; therefore, resulting in a lower milling rate in the center area as compared to the periphery. Curve 37 theoretically has an ion density distribution that produces uniform delayering of the milled area. This curve is unique for given layer characteristics and needs to be determined layer by layer and chip to chip. Because of this factor, it is critical to develop a unique mathematical milling control algorithm such that the corresponding ion density distribution curve 37 is effective in uniformly removing material from layers possessing differing geometries and elemental compositions.

Figure 4:
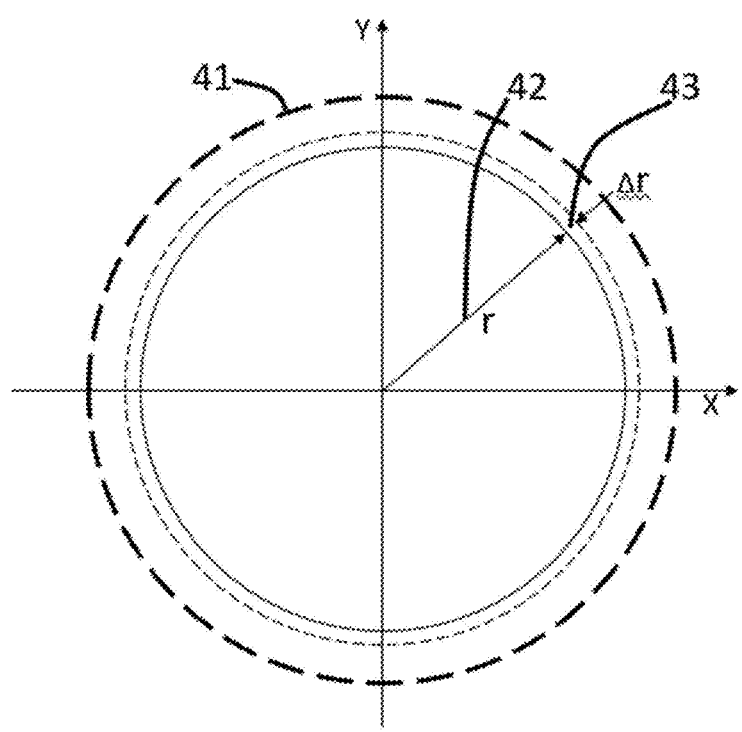
FIG. 4 is a diagram of the theoretical basis for the algorithm used to control the ion density distribution of the present invention as a function of the milled area radius.

FIG. 4 shows a diagram of the milling area 41 on the sample surface. The diameter is in the millimeter scale. The goal is to achieve a uniform ion density distribution at every position within the milling area 41.

To achieve this purpose, a sub-millimeter diameter ion beam is generated and scanned within the desired area and with characteristics to uniformly distribute ion beam density within milling area 41.

The system thus avoids the drawback of having a Gaussian ion density distribution within the ion beam itself which is a characteristic of broad ion beam technology.

To achieve the desired function, a sub-millimeter beam is rastered with respect to the sample surface, point by point, with the intensity of the beam being determined by the rate of movement, thus causing the dwell time at each point of the sample surface to be variable. The dwell time $\Delta t$ divided per unit milling area A must be the same, or equal to constant C.

$$\Delta t/A = C \quad (5)$$

$$\text{or } \Delta t = C*A \quad (6)$$

The factor r is a radius 42 within the milling area 41, while $\Delta r$ is an increment 43 of the radius in FIG. 4 following the equations:

$$\Delta t = C*A = C*2\pi r*\Delta r$$

$$dt = C*2\pi r*dr$$

$$\int dt = C*2\pi r*\int dr$$

$$t = C*2\pi r^2$$

$$r = a*t^{1/2} \text{ (a is a constant)} \quad (7)$$

For practical use, it is necessary to extend the equation (7) to the following:

$$r = a*t^k \text{ (a is a constant, } 0<k<=1) \quad (8)$$

where k is the milling factor. Equation (7) is a special case of equation (8) when k=1/2. When k=1, the ion density distribution is equivalent to curve 35 in FIG. 3. When k is reduced to a value slightly less than 1, the ion density distribution is equivalent to curve 36 in FIG. 3. When k is further reduced, the ion density distribution is equivalent to curve 37 in FIG. 3. A subsequent reduction in k yields an ion density distribution equivalent to curve 38 in FIG. 3. In practice, it is necessary to determine the k value for different material and layer configurations in order to achieve uniform delayering.

Figure 5:
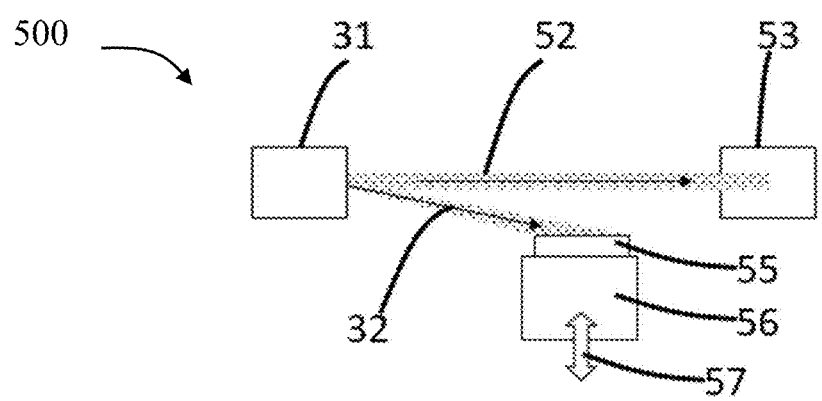
FIG. 5 is a schematic diagram of the relative position of certain components of the present invention.

During an ionization and extraction process, some ions can be neutralized by capturing electrons. These neutrally charged particles move purely as a function of their momentum and cannot be steered. Therefore, their impingement upon a sample surface typically results in uneven, uncontrolled milling of the sample surface. To avoid this problem, the present system and method includes a means of specifically steering only charged ion particles. FIG. 5 shows a basic diagram of the present system 500. An initial ion beam 52 is generated and emitted from at least one ion source 31 and is directed to Faraday cup 53. In this condition, the entire beam is directed into the Faraday cup 53 and no milling occurs. In at least one embodiment, the Faraday cup 53 can also be used to measure ion beam current.

To precisely control the ion beam for uniform delayering, the ion source 31 of the present invention includes Y deflection electrodes which, when voltage is applied, creates an electrostatic field that deflects a portion of the initial ion beam 52 to create an incident ion beam 32 directed off-axis to impinge upon the sample surface 55, as shown in FIG. 5. Because only ions are affected by the electrostatic field, they are directed or steered to create the incident ion beam 32 by Y deflection. Neutral particles are unaffected by the electrostatic field and remain in the initial beam 52 which impacts the Faraday cup 53 rather than the sample. In this manner, only charged particles impact the sample surface 55 for delayering.

The sample is supported on a sample stage 56 which can be adjusted in height along axis 57 and may be moved in the X-Y directions. The ion source 31 also includes X-X ion beam deflection electrodes which raster, scan or steer the incident ion beam 32 with respect to the sample surface 55 according to Equation (8). Under no deflection conditions, the incident ion beam 32 intersects with the sample rotational axis at a plane above the sample surface 55 and parallel to the axial center line of the ion source 31. The sample surface 55 is perpendicular to the sample rotation axis. The beam scanning direction along the X axis in FIG. 3 must be parallel to the sample surface 55. During delayering, the sample 1 is either fixed or rotatable in the clockwise or counterclockwise direction at an appropriate speed. Rotation normalizes milling across the entire sample surface 55 and compensates for the incident ion beam 32 only being rastered in the X-direction.

The beam incident angle with respect to the sample surface 55 is determined by the bending signal strength or voltage as it relates to both the electrical potential applied to the Y deflection electrode and the stage height. Utilizing a larger voltage increases the incident angle. Adjusting the sample stage 56 height upward so that it approaches the plane of the initial ion beam 52 without deflection reduces the incident angle. The beam incident angle is normally adjustable in the range of 0 to 15 degrees.

Figure 6:
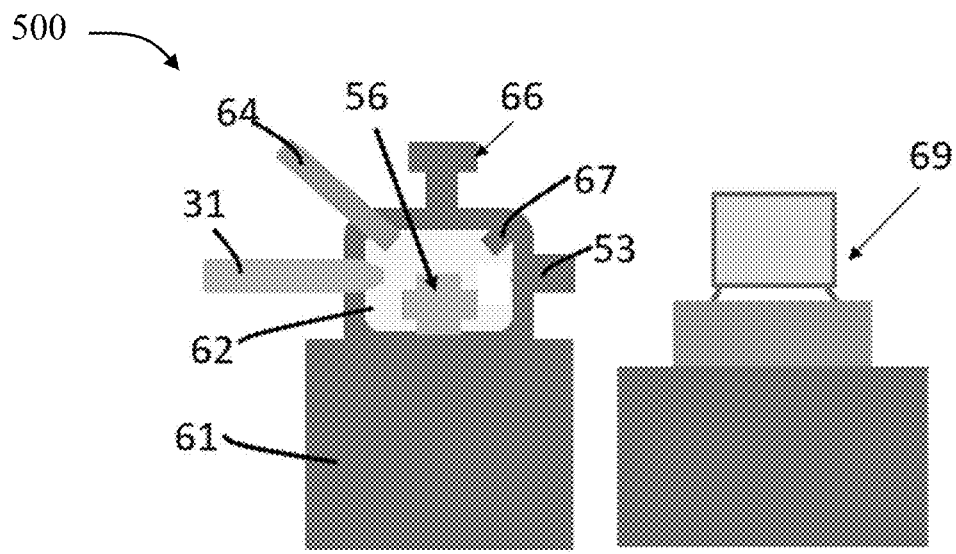
FIG. 6 is a schematic diagram of the present invention.
Figure 7:
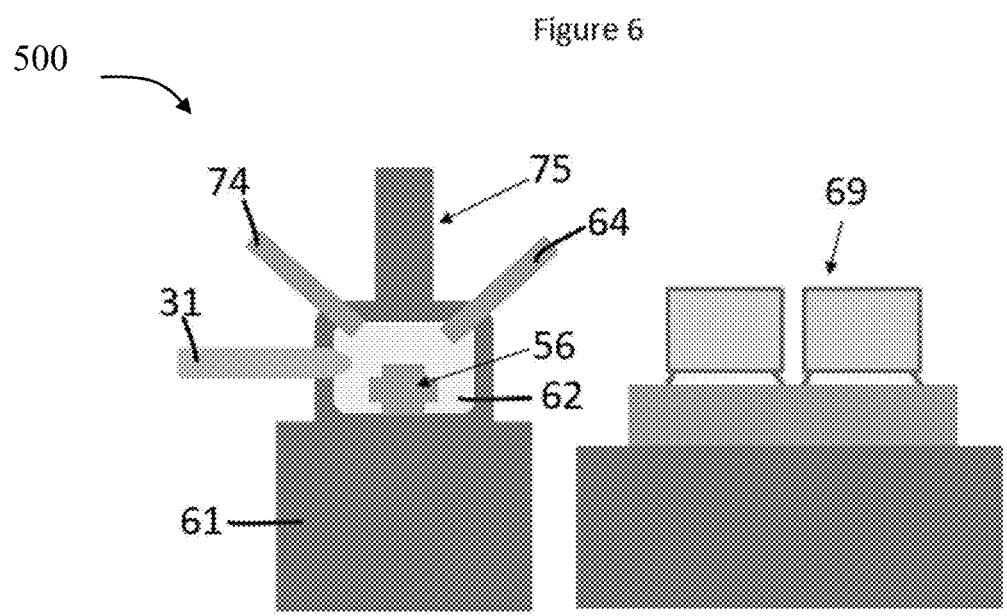
FIG. 7 is a schematic diagram of the present invention.
Figure 8:
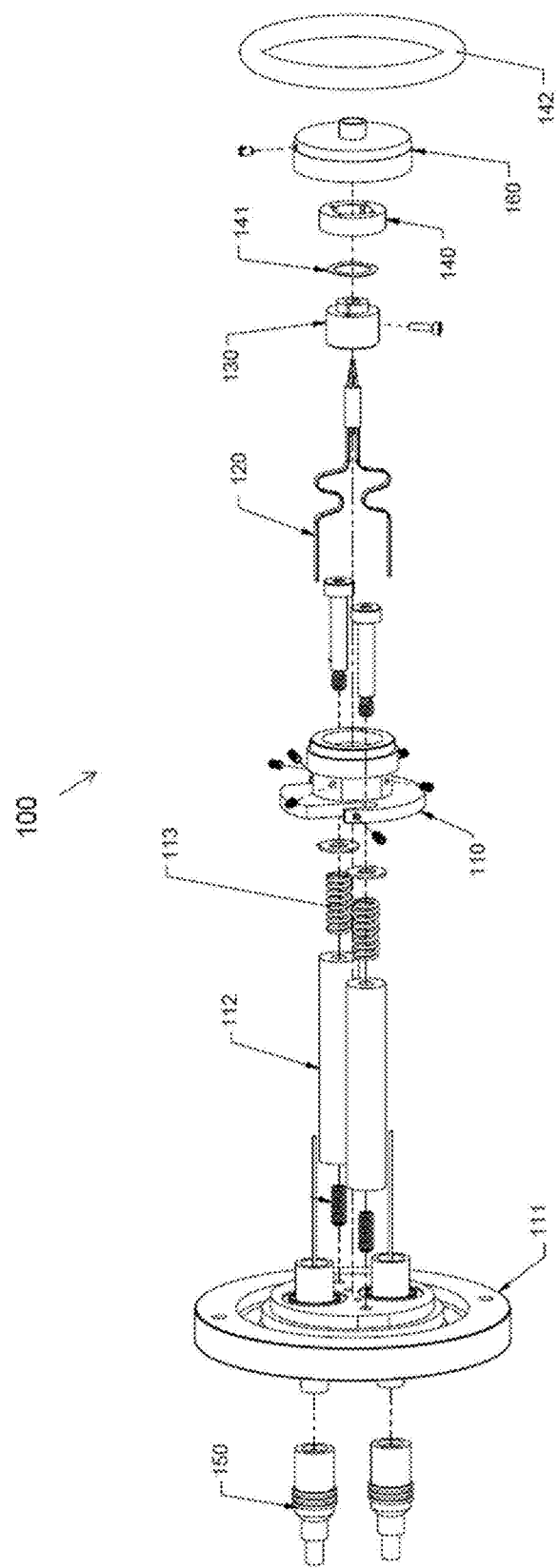
FIG. 8 is an exploded view of the electron source assembly of the present invention.
Figure 9A:
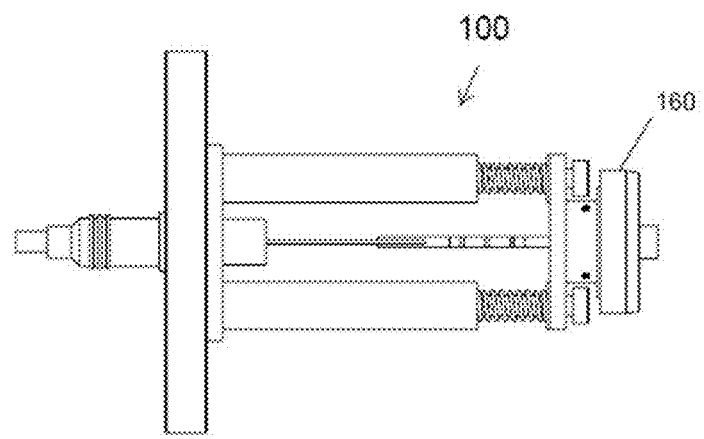
FIG. 9A is a view of the electron source assembly of FIG. 8.
Figure 9B:
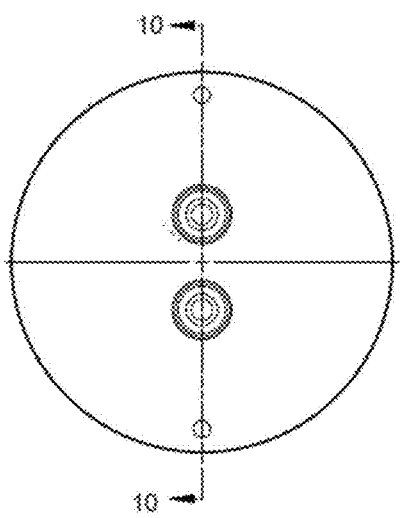
FIG. 9B is an end view of the electron source assembly of FIG. 9A.
Figure 10:
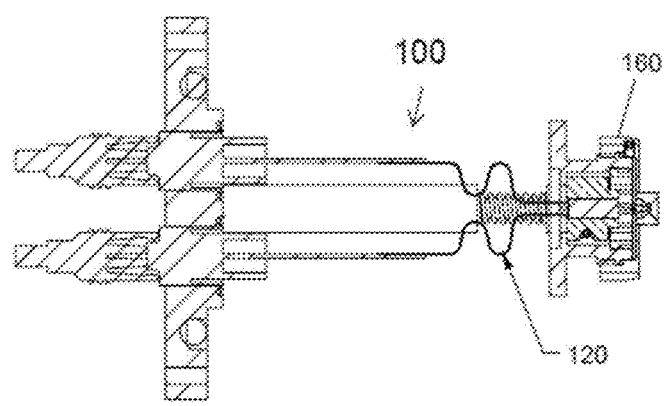
FIG. 10 is a cross-sectional view of the electron source assembly shown along line 10-10 of FIG. 9B.
Figure 11A:
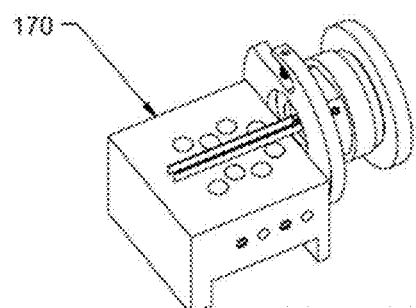
FIG. 11A is an isometric view of the filament assembly and bending tool.
Figure 11B:
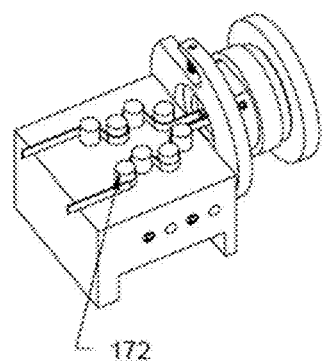
FIG. 11B is an isometric view of the filament assembly showing use of pins to bend the filament wire.
Figure 12:
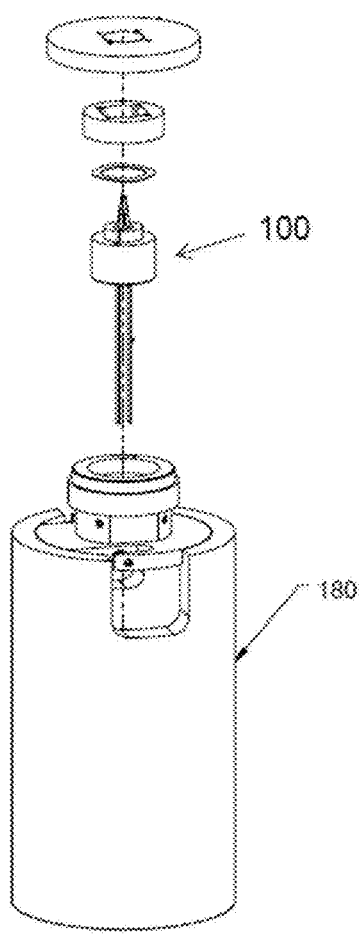
FIG. 12 is a partially exploded view of the filament assembly and loading stand.
Figure 13A:
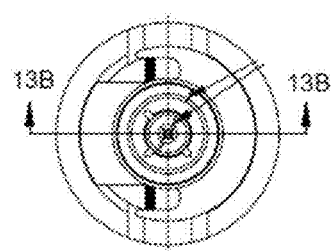
FIG. 13A is a top plan view of the filament assembly and loading stand of FIG. 12.
Figure 13B:
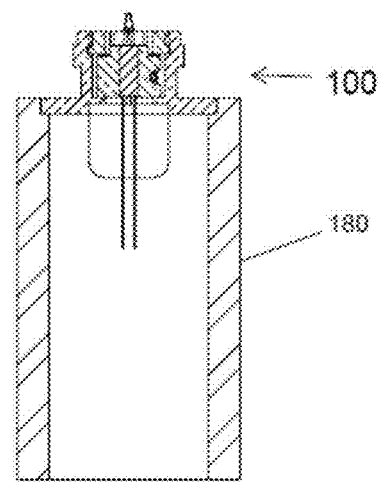
FIG. 13B is a cross-sectional view of the filament assembly and loading stand shown along line 13B-13B of FIG. 13A.

Turning now to the system 500 overall, as shown in FIGS. 6 and 7, the system 500 includes an ion beam source 31, a sample stage 56, a vacuum chamber 62, a source controller 61 (not shown), a control unit 69 and various detectors. The sample stage 56 is configured and positioned to support a sample 1 thereon, such as but not limited to IC chips, partial IC chips, multiple IC chips, any kind of wafer, or other types of sample material. The sample stage 56 possesses Z-stage height adjustment along the axis 57 as shown in FIG. 5, as well as rotational capabilities and X-Y offset as described previously. Rotation is employed to normalize the effect of the ion milling process on the chip surface. The rotational speed range of the sample stage 56 may be between 0.0 and 100 rpm. The stage 56 may also have tilt capabilities. In some embodiments, the sample stage 56 can be cryogenically cooled to near liquid nitrogen temperature. A thermal heater, temperature sensor, and control electronics allow the sample temperature to be regulated between cryogenic and room temperature.

The vacuum chamber 62 provides a hollow space in which the ion beam source 31, sample stage 56, sample 1, and various detectors are contained. The vacuum chamber 62 is part of a vacuum system which also includes a primary pump, preferably a turbomolecular type, a secondary or backing pump, valves, drive circuitry and a control system which may be electrical or pneumatic, and is used to create a vacuum or negative pressure condition within the vacuum chamber 62 during use. The vacuum chamber may be mounted to a frame which provides suitable vibration isolation. The vacuum system may include a controller and gauging to output base and operating vacuum levels.

The sample 1 may be loaded into the system by incorporation of a load-lock assembly possessing both vacuum and inert gas transfer capabilities. With this methodology, the sample can be protected from the environment throughout preparation and subsequent imaging and analysis. This is particularly important for samples which are environmentally sensitive such as, but not limited to, catalysts and lithium ion battery materials.

The ion beam source 31 is composed of a filament assembly 100, an ionizer assembly 200, and a focus assembly 300, all as shown in greater detail throughout FIGS. 8-21. Specifically, the filament assembly 100, depicted in FIGS. 8-13B, is the primary electron source. It includes mount 110 connected to a filament lid 111 separated by standoffs 112 and springs 113. At least one filament 120 is secured to the mount 110 by a clamp 130 and retainer 140. The filament(s) 120 may be yttrium oxide coated iridium, tungsten, or other suitable materials for producing electrons. Connectors 150 are in electrical communication with the filament 120 and provide electric current to the filament 120 which creates a flow of electrons. Preferably, there is one connector 150 for each filament lead. These filament leads may be bent or formed into shapes by using bending tool 170 in which the filament leads are bent around pins 172, which may be pushed up or down to accommodate wire bending as described more fully with reference to FIG. 11. A stand 180 may be used for loading the filament assembly 100 as more fully described with reference to FIG. 13. A Wehnelt electrode 160 surrounds one end of the filament 120. An electrical bias applied to the Wehnelt electrode 160 draws electrons from the filament 120.

Figure 14:
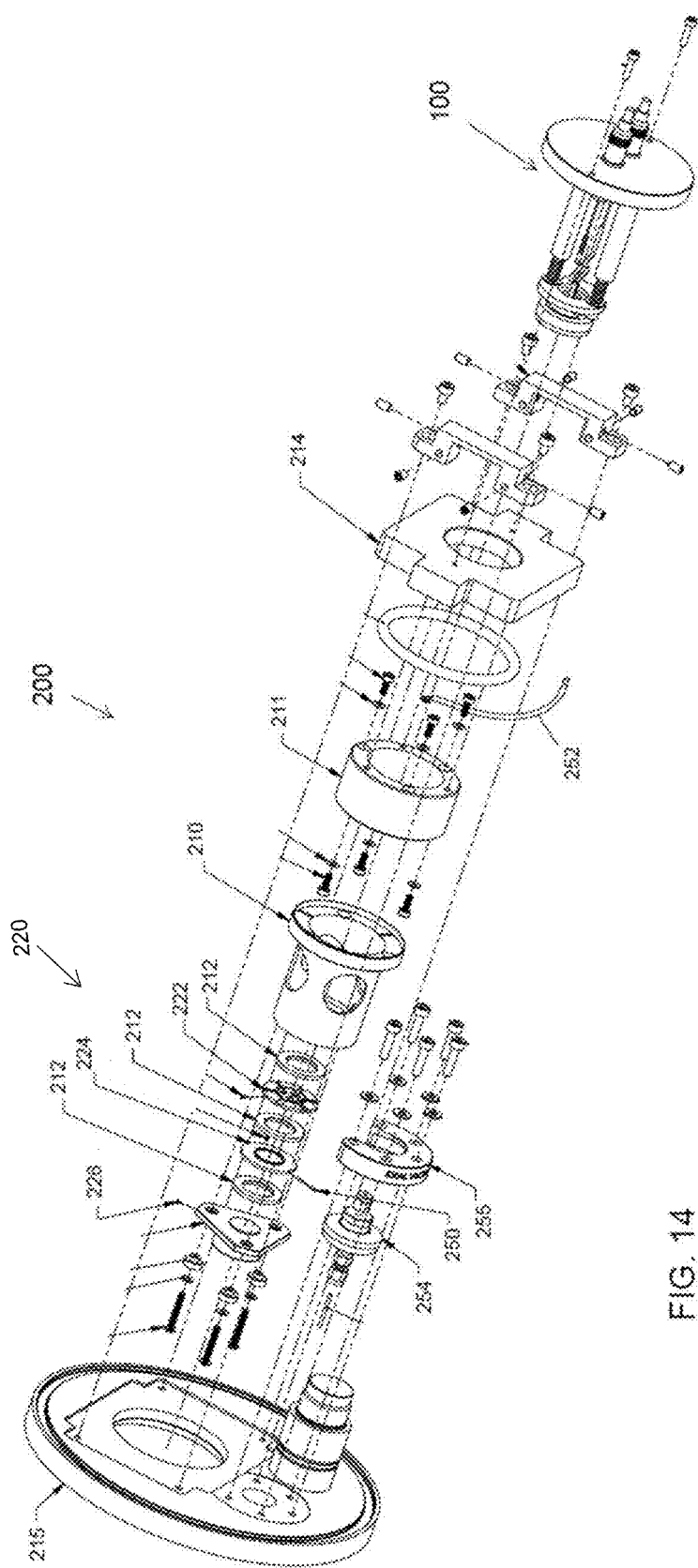
FIG. 14 is an exploded view of the ionization assembly of the present invention.
Figure 16:
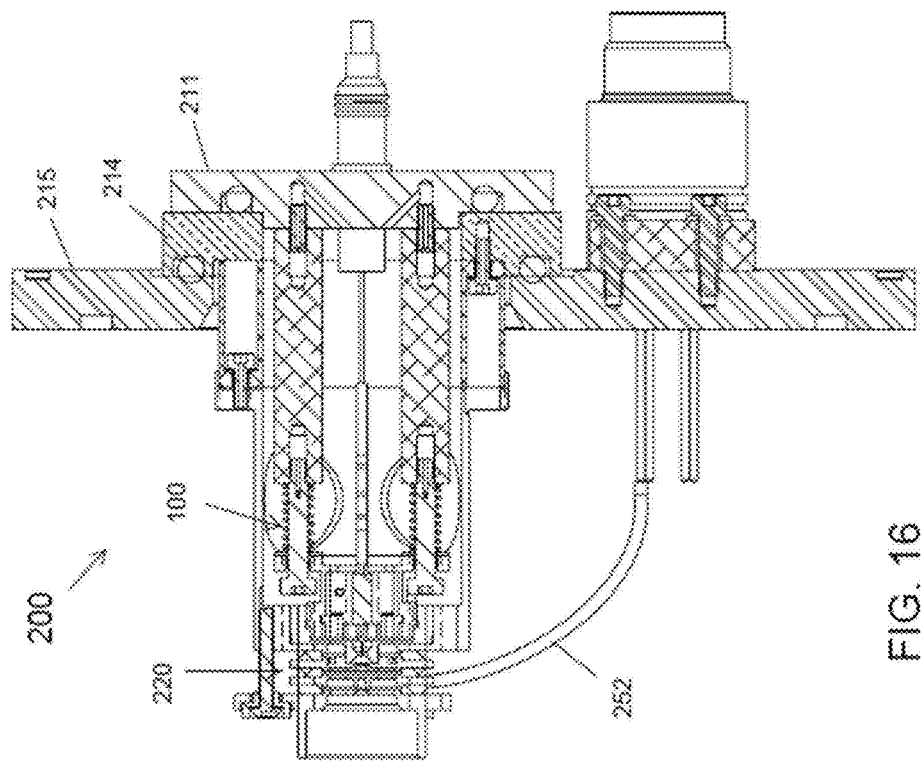
FIG. 16 is a cross-sectional view of the ionization assembly shown along line 16-16 of FIG. 15.
Figure 15:
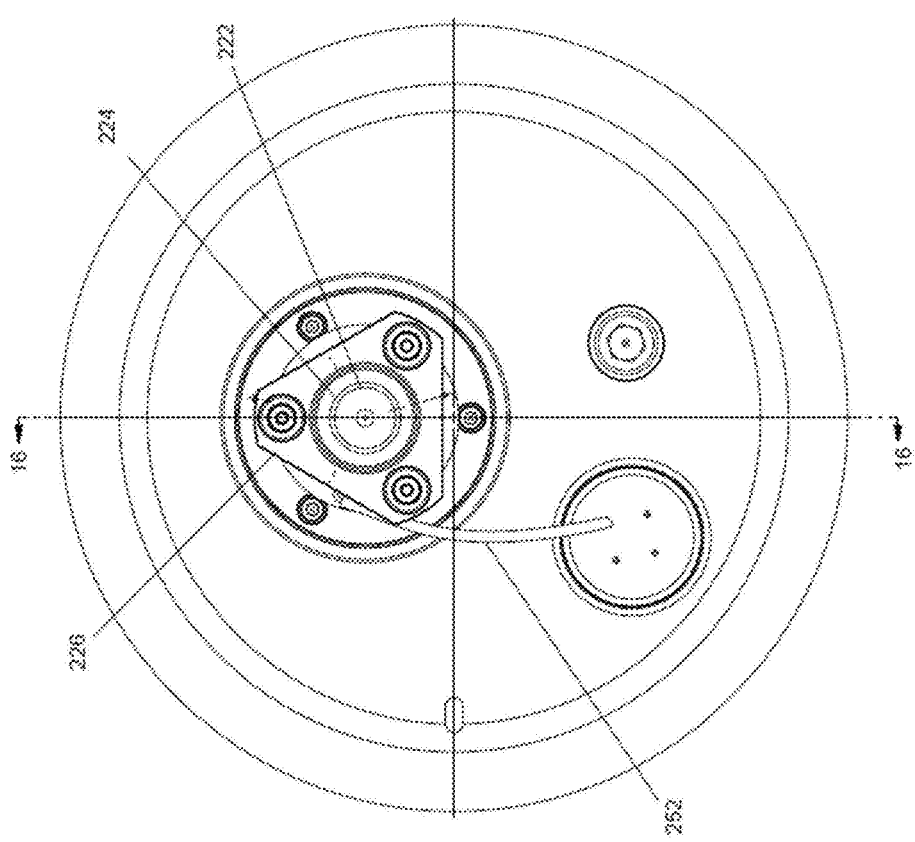
FIG. 15 is an end plan view of the ionization assembly of FIG. 14.
Figure 17:
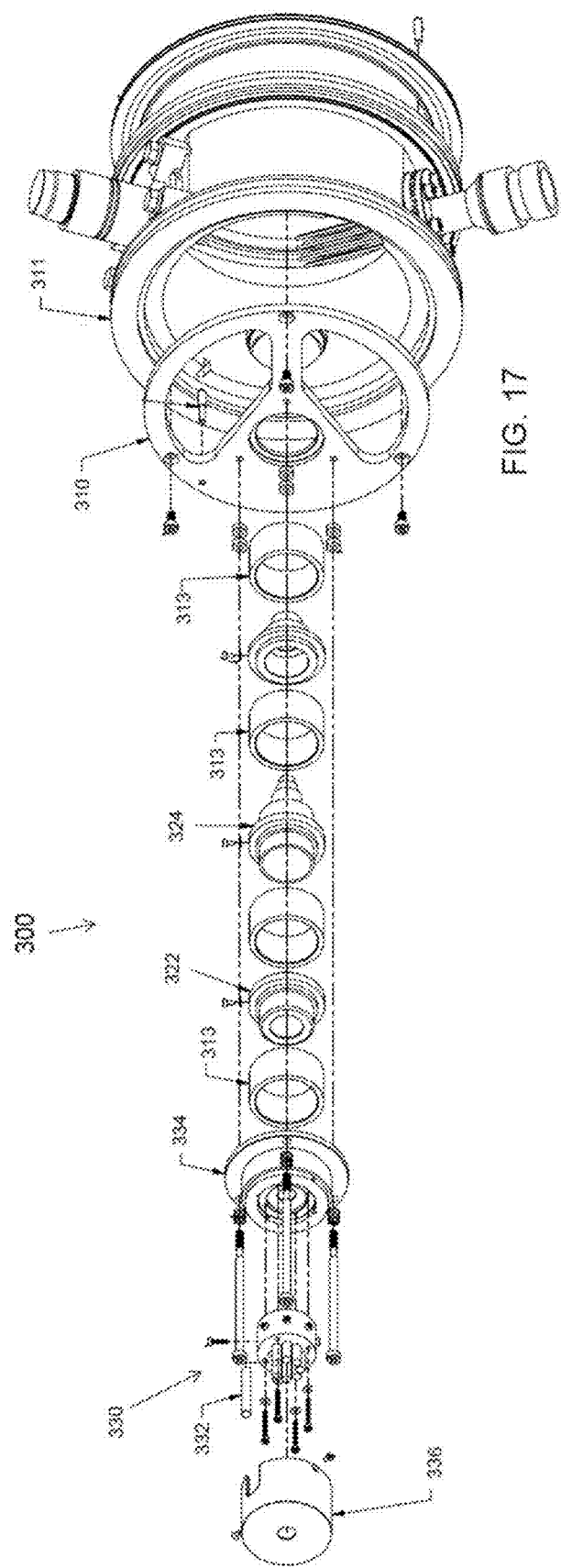
FIG. 17 is an exploded view of the focus assembly and beam steering assembly of the present invention.
Figure 18:
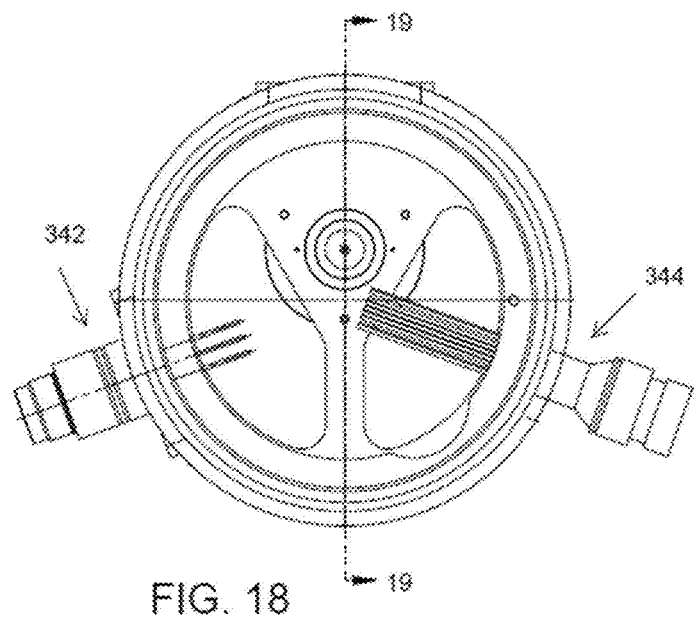
FIG. 18 is an end view of the focus assembly of FIG. 17.
Figure 19:
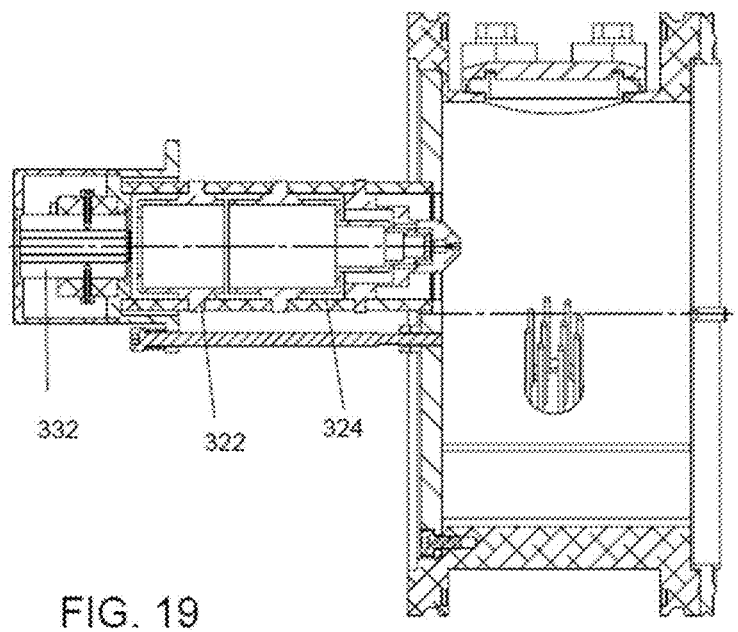
FIG. 19 is a cross-sectional view of the focus assembly shown along line 19-19 of FIG. 18.
Figure 20:
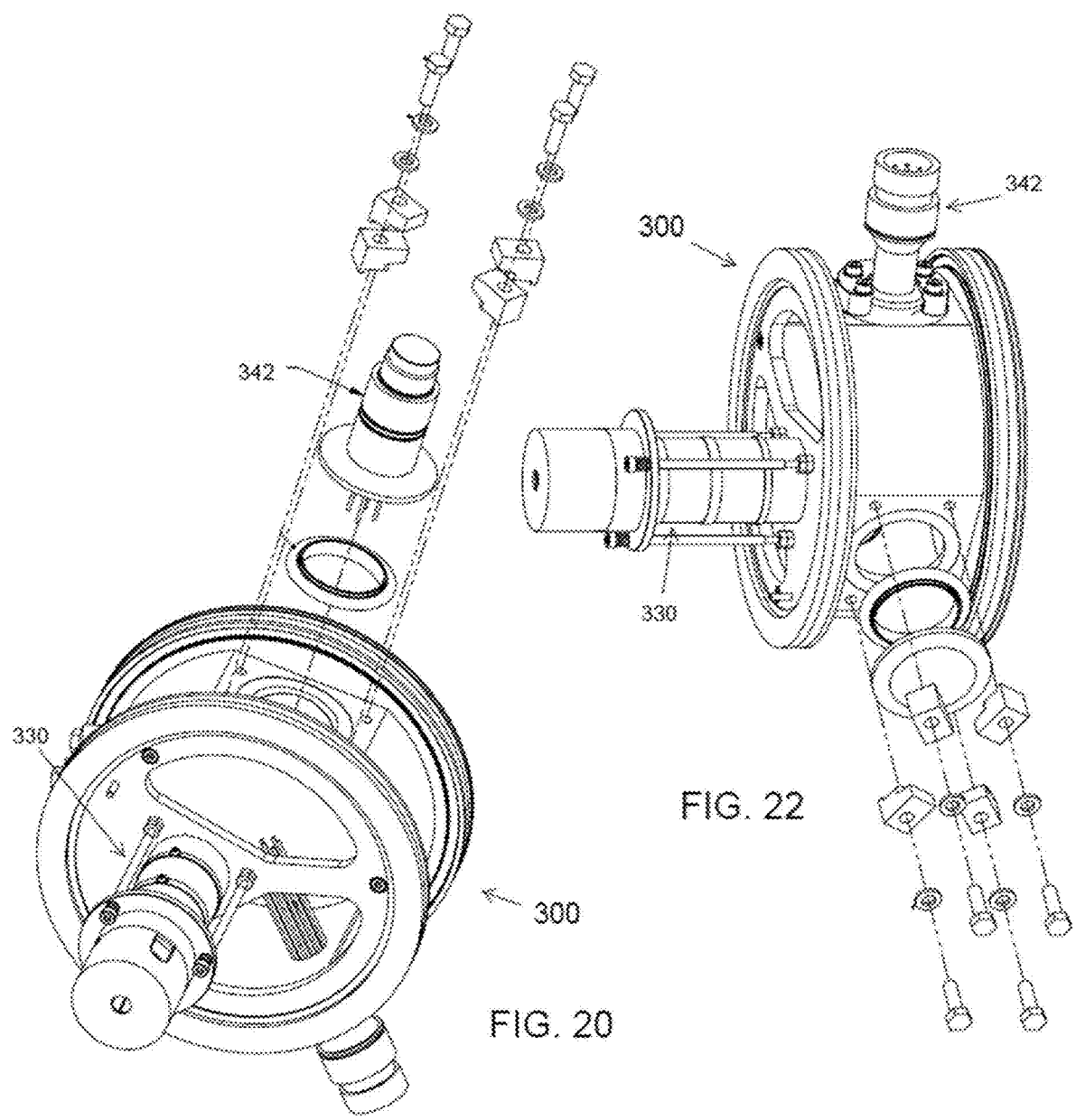
FIG. 20 is a partially exploded view of the focus assembly of FIG. 18 showing the first electrical input.
Figure 21:
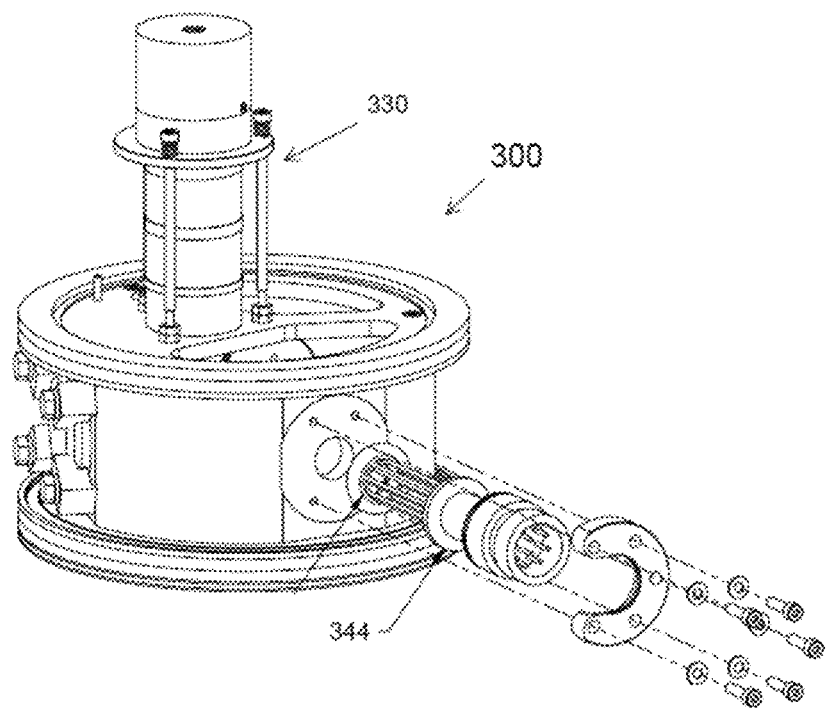
FIG. 21 is a partially exploded view of the focus assembly of FIG. 18 showing the second electrical input.

The filament assembly 100 is physically coupled to the ionizer assembly 200, as shown in FIGS. 14-16. The ionizer assembly 200 includes a Wehnelt support 210 into which the filament assembly 100 is loaded and retained. The Wehnelt support 210 is mounted through a spacer 211 to an adjustment plate 214, which in turn is mounted to an ionizer flange 215 such that the Wehnelt support 210 aligns with an aperture in the ionizer flange 215.

At least one ion source 220 is included in the ionizer assembly 200 between the terminal end of the Wehnelt electrode 160 and the aperture of the ionizer flange 215. For instance, the ion source 220 may include a G2 electrode 222, also referred to as a G2 aperture, and an E electrode 224, which are separated from one another by an insulator 212. An F electrode 226, or F aperture may also be included among the ion sources 220 and is physically separated from the extractor 224 by an insulator 212.

The E electrode 224 has two inputs: the receipt of an electrical bias and a capillary gas input 250. The gas input 250 is connected to a capillary tube 252 which is in fluid flow communication with a gas feedthrough 254 for providing the flow of process gas into the ion sources 220. A clamp 255 may secure the gas feedthrough 254 to the ionizer flange 215. The process gas provided by the gas feedthrough 254 may be argon, xenon or any other gases such as inert gases or combinations thereof. The gas flow rate is adjustable in the range of fractions of a standard cubic centimeter per minute (SCCM) to 10's of SCCM and may be preferably around 0.02 SCCM or greater, though other flow rates are also contemplated.

In a typical gaseous ion source, ionization takes place in a chamber held at a high voltage potential with respect to ground, which creates ions and then provides acceleration of the ion beam to a grounded system, and at a pressure far lower than atmospheric, typically a few Pascal. The supply of gas is usually grounded and at a pressure far above atmospheric. Gas must be moved from a high-pressure state at ground potential to a low-pressure state at high electrical potential. One configuration for gas delivery is a mass-flow controller at ground potential, followed by an insulating tube, usually inside the vacuum. The tube has a large inner diameter so that the pressure drop across the tube is negligible, causing the pressure inside the tube to be only slightly higher than inside the ionization chamber. Most of the pressure drop occurs within the mass-flow controller. Unfortunately, optimal ionization pressure is usually near the minimum of the Paschen curve, so that glow discharges are not easily prevented inside the insulating tube because of the voltage gradient it supports. This generally puts an upper limit on the ionization chamber pressure that can be used, and/or an upper limit on ion beam potential.

To solve this problem, the present invention uses a capillary tube 252 to deliver the process gas. This capillary tube 252 has a very small inner diameter. In light of the transition from laminar flow prior to the capillary tube 252 to molecular flow inside the capillary tube 252, the pressure profile inside the capillary tube 252 is not linear. Rather, it is nearly flat until close to the end of the tube, with a large pressure drop at the outlet. Consequently, most of the length of the capillary tube 252 is at a pressure much higher than the ionization chamber. With a high pressure inside the capillary tube 252, high voltages can be supported within the ionizer assembly 200 without danger of gaseous discharges inside the tube. This allows essentially arbitrary combinations of voltage, ionization pressure, and flow rate to the ion source 220, resulting in improved performance and reliability.

Electrical biases are individually applied to each of the G2 electrode 222, the E electrode 224, and the F electrode 226. Electrons emitted from the Wehnelt electrode 160 strike gas atoms in the region surrounding the ion sources 220. An individual collision results in the loss of an electron from a gas atom. Multiple collisions create significant quantities of ions.

These ions exit the ionizer assembly 200 and are directed into the focus assembly 300, shown in FIGS. 17-21. The focus assembly 300 includes a support plate 310 that physically secures the lens. The open structure of the support plate 310 allows for vacuum pumping of the various ion source 220 regions. A spacer 313 physically and electrically separates an extractor from the ion source 220. An electrical bias is applied to the extractor, which attracts ions emitted from the ion source 220 region. Ions are further controlled by an electrical bias applied to a drift tube 324 and a focus electrode 322.

The focus assembly 300 also contains a steering assembly 330, which is capable of electrostatically guiding the beam. The steering assembly 330 preferably includes a plurality of individually electrically biased steering electrodes in the form of steering rods 332 which are contained within steering rod insulators 334. Some of the steeling rods 332 are X deflection electrodes while other steering rods 332 are deflection electrodes. The steering rods 332 may be individually electrically biased to allow for the precise steering and scanning of the resulting ion beam with a deflection of approximately +/−15 degrees. A steering rod cover 336 encloses the steering deflector rods 332 and their corresponding insulators 334. The focus assembly 300 also includes electrical inputs 342 and 344 which are positioned along housing 311 of the assembly. An exemplary configuration may include a first electrical input 342 providing 12 kV and up to 20 amps of power. A second electrical input 344 may provide 700V with a current of up to 5 amps. One of these may be used to create the incident ion beam 32 described previously. The other provides the electrical bias for deflecting the resulting ion beam toward the sample and steering the incident ion beam 32 across the sample surface 55, for rastering purposes.

The ion beam source 31 described above is capable of generating an ion beam having a beam energy in the range of 1 keV-50 keV or greater and may be continuously adjustable with 1 eV accuracy. Higher beam energy can increase the milling rate but result in sample surface damage. Lower energy can produce a smooth sample surface and less damage, but at a reduced milling rate.

1. The resulting ion beam diameter may be in the range of 50 μm-5 mm and may be adjustable dependent upon the energy level. For example, the beam size may be 50 μm at 10 keV with a current of 0.1-7 μA in some embodiments, and 1.0 mm at 1 keV with a current of 7-15 μA in other embodiments. The ion beam may have a current between 1 μA to 1000 μA, inclusive. Preferably, the current is up to 200 μA. Greater current can increase the milling rate. The current density of the ion beam may be approximately 10 mA/cm$^2$. The ion source may be operable in a working distance in the range of 10 mm-100 mm with a raster range of up to 12 mm$^2$ or greater. In at least one embodiment, the raster range may be 10 mm diameter at a 25 mm working distance.

As can be appreciated from FIGS. 8-21, the modular design of the ion beam source 31 allows for both rapid replacement of the filament 120 and in situ x-y adjustment of the ionizer assembly 200 with respect to the lens.

The direction of ions emanating from the ion beam source 31 is above and preferably parallel to the sample surface 55, as shown by the initial ion beam 52 in FIG. 5. The incident ion beam angle is adjustable by varying the sample height along the Y axis 57 and the beam Y deflection bending amplitude caused by the steering assembly 300. Using this combination of adjustments, the impingement point of the incident ion beam 32 coincides with the sample rotation axis 34. Utilizing the deflection electrodes of the steering rods 332, the incident ion beam 32 is scanned from edge to edge of the sample surface 55.

Returning to FIGS. 6 and 7, the system 500 includes a source controller 61 that provides the operative instructions to adjust the ion beam voltage, current, extraction voltage, beam size, gas flow rate, and filament emission. It consists of several high voltage power supplies which control the various assemblies of the ion beam source 31 discussed above, including ion beam energy, focus, ion extraction, as well as the deflection amplifiers for beam rastering in the X direction and deflecting or bending the ion beam in the Y direction onto the sample surface 55, shown in FIG. 5. An adjustable amplitude raster control distributes ion density along the X direction so that uniform delayering of a large area is achieved. The source controller 61 also controls and adjusts the raster rate of the incident ion beam 32 with respect to each location projecting from the sample center to its largest radius.

The ion beam source 31 can be mechanically moved in the X and Y directions and rotated. Physically changing the X-adjustment without scanning positions the ion beam 32 with respect to the sample rotational axis. Changing the Y movement ensures that the ion source is at the appropriate height with respect to the milling plane. Rotational adjustment without the application of X-X deflection ensures that the ion beam position is parallel to the sample surface when it is affixed to the stage 65. This alignment procedure may be conducted during system set-up and calibration.

The system 500 may include a variety of detectors that provide information relating to delayering during the milling process. Each of the detectors is in communication with the control unit 69 to provide data to the control unit 69. Detectors provide information relating to chip feature type, feature locations, feature dimensions, and feature chemical composition.

The system 500 may include a camera 66 and a light source 67 to capture light reflected from the sample surface. Periodically during the milling process, the sample 1 may be illuminated by light source 67. Images are subsequently acquired by camera 66 and sent to the control unit 69. The camera 66 may include various powered objectives for higher or lower resolution imaging. Patterns revealed during delayering may be recognized by image recognition software installed on the control unit 69 for both feature identification and to confirm or adjust the milling process parameters. In addition, the light source 67 may be used to reveal vertical spacing differences between two layers. As milling progresses, interference fringes are developed and correspond to the depth of the milled area. Light reflection and the creation of interference fringes is a very sensitive method for establishing the nonplanarity of the sample surface, even when nonplanarity is on the order of a few nanometers. In an ideal situation, only one interference ring will appear on the image, indicating a very small depth variation between the sample center and its periphery. Increasing quantities of rings correspond to larger depth variations.

During milling, rings first appearing at the sample center are an indication that the milling rate at the center is greater as compared to the surrounding area. When rings appear toward the periphery of the sample, it is an indication that the center is milling at a lower rate as compared to the periphery. If more rings appear, a large milling rate difference exists between the sample center and periphery. If the width of the single ring is large, the milling rate difference would be small. Reflection images can be analyzed by human eyes or by computer image recognition techniques. Accordingly, the milling factor k can be adjusted manually or automatically.

The system 500 may also include a secondary ion mass spectrometer or SIMS 64 which can be used to analyze the elemental composition of material sputtered from the milled surface. Sample layers typically possess a combination of light and heavy elements separated by semi- or non-conductive oxide layers, which when sputtered, can be quantified by SIMS. This quantification can be sent to the control unit 69 for the analysis of the chemistry encountered in each layer for the subsequent determination and identification of chip layer components. Chemical composition analysis is achieved at a point, in an area, and by a map.

As shown in FIG. 7, the system 500 may include an SEM column 75. The SEM column 75 is located directly above the sample stage 56 and generates a beam of electrons that interact with the sample surface 55, yielding secondary and backscatter electrons, as well as x-rays that are subsequently used to quantify depth profile information, provide three-dimensional structural information, and the elemental composition of the sample. A shutter may be positioned adjacent to the SEM objective lens which may be actuated to protect the SEM lens and detectors from the deposition of sputtered particles produced by the delayering process. Acquisition data from different layers by the SEM working in conjunction with the various detectors can be used for the 3-D reconstruction of the sample by creating feature patterns during the delayering process. When a specific feature pattern appears, the delayering process may be adjusted or stopped.

The system 300 may include a sample stage featuring X and Y translation; whereby, the sample position moves with respect to the impingement point of the electron beam. In cases where the desired resolution of the SEM image restricts the field of view, translating the sample to multiple positions allows imaging of the entire sample surface.

A secondary electron detector or SED may also be included for imaging electrons emanating from the sample surface excited by electrons from the electron column or ion-induced secondary electrons as created by ions emanating from the ion source 31. A backscattered electron or BSE detector may also be included to detect backscattered electrons from the sample surface. Backscattered electrons are produced by the elastic scattering of a primary electron beam with an atom's nuclei. Varying the accelerating voltage of the incident electron beam causes the electron penetration depth, or interaction volume, to change. Because information is generated by the nucleus of the atom, an indication of its corresponding element becomes known. This is particularly useful when attempting to distinguish material differences between the various layers within the chip.

The system 500 may also include an energy dispersive spectroscopy or EDS detector 74 which detects x-rays emitted from the sample surface 55 during bombardment by the incident electron beam to characterize the elemental composition of the analyzed volume. Combining BSE and EDS information yields a depth profile of the surface and near sub-surface in the x-y dimensions.

A wavelength dispersive spectroscopy (WDS) probe, Auger detector, laser profiler, X-ray, and/or other probes may also be used in the system, all of which are not shown in the Figures but inclusion of which would be within the ambit of one skilled in this art.

The system 500 also includes a control unit 69. The control unit 69 is in communication with all component parts of the system 500 and establishes the pertinent parameters of the system 500. This includes vacuum conditions within the vacuum chamber 62, adjustment of stage movements, and regulation of the output of a mass flow controller to adjust the amount of process gas supplied to the ion source 31. Accordingly, the control unit 69 provides operative parameters to the ion source controller 61 for operating the ion source 31. It also controls the movement/adjustment of the sample stage 56. The control unit 69 includes a user interface for communication with operators of the system. One or more displays may also be provided on which output data from the detectors may be displayed.

In addition, the control unit 69 receives input from the various detectors and uses this data in the mathematical algorithm to control the ion beam density distribution across the chip surface.

Various signals can be captured by the detectors point-by-point with the size of the point being roughly the size of either the ion or electron beam. The control unit 69 creates a depth profile map from data generated at the sample center, sample periphery, and at any quantity of points in between. A higher quantity of points translates to a higher resolution map. Depth profile variations with respect to their corresponding position are then input into the algorithm.

Analysis of the data from the detectors allows for the adjustment of the milling factor k described in equation (8) in order to achieve uniform delayering. For example, when the milling rate at the sample center is higher than on the periphery, the milling factor k must be reduced. If the milling rate at the sample center is lower than on the periphery, the milling factor k must be increased. The amount of adjustment of k described in Equation (8) is variable and is determined by the variation of the milled depth.

The raster control can be varied to correspond with sample material type, raster amplitude, ion beam energy, ion beam current, and other parameters. Based on this calculation, adjustments to the operative parameters needed to achieve uniform delayering are sent to the relevant system components, such as to the source controller 61 in order to adjust the raster pattern and corresponding positional current density of the ion beam 32. The result is physically altering the ion beam raster pattern in terms of both raster rate and the corresponding current density per point, with the intention of minimizing $\Delta d$. Accordingly, the control unit 69 may adjust the milling factor k in near-real time by analyzing the output of the various detectors.

When the material removal rate for a given layer of a given thickness is identical, the process can be repeated to remove subsequent layers in a stepwise fashion by utilizing identical ion beam control parameters. This method may comprise some quantity of predetermined steps to automatically remove multiple layers from the chip.

An objective of the system is to precisely control milling rate, combined with determining the process end point. The simplest form of end-point determination is by time; however, for this to be effective, both the layer thickness and milling rate need to be very well understood. The milling time is calculated using a predetermined desired delayering depth because the milling rate is known at specific beam energies for various materials. Once the end point is determined, the control unit 69 stops the process by deenergizing the ion source 31.

The end point can also be determined by features or specific chemical compositions appearing on the images or analytical data during delayering. If chemical compositions are needed at some specific depth, EDS 74, SIMS 64 or other chemical analysis data is relied upon to identify the end point.

For system calibration of milling rate over a given area, a multi-layer control sample, with each layer possessing a different elemental composition, should be employed. The layer thicknesses of such sample need to be uniform and on the order of 5-50 nanometers per layer. Thicker layers can be tolerated; however, this increases the overall milling/calibration time.

Since many modifications, variations and changes in detail can be made to the described preferred embodiments, it is intended that all matters in the foregoing description and shown in the accompanying drawings be interpreted as illustrative and not in a limiting sense. Thus, the scope of the invention should be determined by the appended claims and their legal equivalents.

What is claimed:

1. A system for delayering of a sample consisting of generally planar, parallel layers, comprising:
   a. a movable sample stage supporting a sample at a plurality of locations in a vacuum chamber;
   b. an ion beam source within said vacuum chamber having at least one ion source generating a generally columnar ion beam;
   c. a deflector diverting said charged ion beam from an initial beam path to raster said ion beam in at least one direction directly upon and along a surface of said sample over a raster range;
   d. at least one detector within said vacuum chamber for generating an output signal including data indicative of the elemental composition of an area of interest portion of said sample surface, said detector selected from the group consisting of an optical microscope, a CCD camera, a CMOS camera, a scanning electron microscope, a secondary electron detector, a backscatter electron detector, an energy dispersive spectrometer, a secondary ion mass spectrometer and an auger probe; and
   e. a control circuit in electronic communication with said deflector, said ion beam source and said at least one detector, said control circuit:
      i. generating said charged ion beam with said ion beam source and operating said deflector to cause said charged ion beam to remove material from said sample surface associated with said area of interest portion;
      ii. obtaining elemental composition data from said at least one detector output signal relative to said area of interest portion,
      iii. determining whether said area of interest portion has been appropriately exposed generally planar to at least one of said parallel layers of said sample based upon the identification of said elemental composition of said area of interest portion; and
      iv. modifying at least one of: accelerating voltage, ion flux density, spot size, raster rate, raster dimension and dwell time of said ion beam source based upon said identification of said elemental composition to provide a time-averaged flux of ions per unit area as a function of position and time on said sample surface to realize substantially planar material removal at said area of interest portion.

2. The system according to claim 1, wherein said ion beam source is selected from a gaseous type or liquid metal type.

3. The system according to claim 1, wherein said ion beam spot size is in the range of 50 μm to 5 mm.

4. The system according to claim 1 wherein adjustment of said ion beam creates a uniformly milled sample surface independent of sample composition and layer geometry.

5. The system according to claim 1 wherein the ion beam source is arranged to emit the ion beam substantially parallel to the stage and sample.

6. The system according to claim 1, wherein the axis of said ion beam is substantially parallel to and offset from the planar surface of said sample.

7. The system according to claim 5, wherein said deflector directs said ion beam from a path substantially parallel to said planar surface of said sample to a path intersecting said planar surface.

8. The system according to claim 1, wherein said deflector causes said ion beam to move selectively across at least a portion of said sample surface.

9. The system according to claim 8, wherein said raster range of said ion beam is selected from one of: (i) substantially the entire surface of the sample or larger; and (ii) a limited area within the surface of the sample.

10. The system according to claim 1 wherein said sample stage can be adjusted in at least one of the X, Y, Z, and rotational directions.

11. The system according to claim 10, wherein said adjustment in said rotational direction is in the range of 0 and 100 rpm.

12. The system according to claim 1 wherein said sample stage can be temperature regulated between ambient and cryogenic temperatures.

13. The system according to claim 1, wherein said detector is a scanning electron microscope, being configured to vary its accelerating voltage to derive information from the sample surface and sub-structure.

14. The system according to claim 1, wherein said detector is a secondary electron detector which detects relative beam position and characteristics of said sample surface by impingement of one of said ion beam and an electron beam.

15. The system according to claim 1, wherein said detector is a backscatter electron detector which detects sample surface and substructure characteristics by impingement of an electron beam operated at least one voltage.

16. The system according to claim 1, wherein said ion beam source further comprises a filament, an ionization chamber, and a focusing lens.

17. The system according to claim 16, wherein said filament is mounted to a cartridge, which is removable from the remainder of the ion source.

18. The system according to claim 1, wherein said milling rate at a given position on said sample is a function of said ion beam dwell time at said position.

19. The system according to claim 1, wherein the ion beam has an incident milling angle range between 0.0 and 15 degrees.

20. The system according to claim 1, wherein the ion beam has an incident milling angle greater than 15 degrees.

21. The system according to claim 1, wherein the rate of change of deflection of said ion beam is variable as it moves across the sample surface.

22. The system according to claim 1, wherein said ion beam has a selectively adjustable energy level between 1 keV to 50 keV, inclusive.

23. The system according to claim 1, wherein said ion beam has a beam current between 1 μA to 1000 μA, inclusive.

24. The system according to claim 1, further comprising an electron beam source within said vacuum chamber generating a generally columnar ion beam selectively impinging on said sample surface.

25. The system according to claim 24 wherein electrons from said electron beam source impinging on said sample surface cause at least one of deflected electrons and electromagnetic radiation to be emitted from said sample surface.

26. The system according to claim 25 wherein said at least one detector detects said at least one of deflected electrons and emitted electromagnetic radiation for generating said output signal.

27. The system according to claim 1, wherein said control circuit correlates at least one output signal with a predefined elemental composition.

28. The system according to claim 1, wherein said control circuit calculates depth and planarity data from said output signal indicative of the elemental composition of the area of interest portion.

\* \* \* \* \*